United States Patent
Soldner et al.

(10) Patent No.: US 7,609,495 B2
(45) Date of Patent: Oct. 27, 2009

(54) ELECTROSTATIC DISCHARGE (ESD) PROTECTION ARRANGEMENT AND ESD PROTECTION METHOD

(75) Inventors: Wolfgang Soldner, Munich (DE); Harald Gossner, Riemerling (DE)

(73) Assignee: Infineon Technologies AG, Munich (DE)

( * ) Notice: Subject to any disclaimer, the term of this patent is extended or adjusted under 35 U.S.C. 154(b) by 276 days.

(21) Appl. No.: 11/590,677

(22) Filed: Oct. 31, 2006

(65) Prior Publication Data

US 2008/0100973 A1    May 1, 2008

(51) Int. Cl.
    *H02H 3/22*    (2006.01)
(52) U.S. Cl. .......................... 361/56; 361/111
(58) Field of Classification Search ............. 361/56, 361/111
    See application file for complete search history.

(56) References Cited

U.S. PATENT DOCUMENTS

| | | | |
|---|---|---|---|
| 4,048,584 A * | 9/1977 | Ulmer | 331/62 |
| 4,068,278 A * | 1/1978 | Williams | 361/56 |
| 5,563,757 A | 10/1996 | Corsi | |
| 6,696,730 B2 * | 2/2004 | Kawazoe et al. | 257/355 |
| 6,825,504 B2 | 11/2004 | Ishizuka et al. | |
| 7,085,113 B2 | 8/2006 | Gauthier, Jr. et al. | |
| 2002/0154463 A1 | 10/2002 | Mergens et al. | |
| 2005/0162790 A1* | 7/2005 | Yoshinaga | 361/56 |

FOREIGN PATENT DOCUMENTS

WO    WO 96/05641    2/1996

OTHER PUBLICATIONS

Opris, Ion E. "Bootstrapped Pad Protection Structure." vol. 33, No. 2. IEEE Journal of Solid-State Circuits: Feb 1998. (2 Pages).

* cited by examiner

*Primary Examiner*—Danny Nguyen
(74) *Attorney, Agent, or Firm*—Maginot, Moore & Beck

(57) ABSTRACT

AN ESD protection arrangement is provided which comprises an ESD protection device coupled between a terminal pad of an integrated semiconductor circuit and a supply voltage rail and a compensation loop provided between the terminal pad and an internal circuit node of the ESD protection device. The compensation loop comprises a phase shifting element to provide a predetermined phase shift between an input voltage of the ESD protection device and a compensation voltage supplied to the internal circuit node of the ESD protection device.

36 Claims, 5 Drawing Sheets

Fig. 2

| Δt | A | | | | | | | | | |
|---|---|---|---|---|---|---|---|---|---|---|
| | 0.5 | 0.6 | 0.7 | 0.8 | 0.9 | 1.0 | 1.1 | 1.2 | 1.3 | 1.4 |
| 0 ps | 0.00 | 0.00 | 0.00 | 0.67 | 0.83 | 1.00 | - | - | - | - |
| 1 ps | 0.00 | 0.00 | 0.00 | 0.33 | 0.41 | 0.50 | - | - | - | - |
| 2 ps | 0.00 | 0.00 | 0.00 | 0.00 | 0.28 | 0.33 | - | - | - | - |
| 3 ps | 0.00 | 0.00 | 0.00 | 0.00 | 0.21 | 0.25 | 0.30 | - | - | - |
| 4 ps | 0.00 | 0.00 | 0.00 | 0.00 | 0.00 | 0.20 | 0.24 | 0.28 | - | - |
| 5 ps | 0.00 | 0.00 | 0.00 | 0.00 | 0.00 | 0.17 | 0.20 | 0.23 | 0.27 | - |
| 6 ps | 0.00 | 0.00 | 0.00 | 0.00 | 0.00 | 0.00 | 0.17 | 0.20 | 0.23 | 0.27 |
| 7 ps | 0.00 | 0.00 | 0.00 | 0.00 | 0.00 | 0.00 | 0.00 | 0.17 | 0.20 | 0.23 |
| 8 ps | 0.00 | 0.00 | 0.00 | 0.00 | 0.00 | 0.00 | 0.00 | 0.00 | 0.18 | 0.21 |
| 9 ps | 0.00 | 0.00 | 0.00 | 0.00 | 0.00 | 0.00 | 0.00 | 0.00 | 0.00 | 0.00 |

ELECTROSTATIC DISCHARGE (ESD) PROTECTION ARRANGEMENT AND ESD PROTECTION METHOD

BACKGROUND OF THE INVENTION

The present invention relates to an electrostatic discharge (ESD) protection arrangement and to an ESD protection method.

Conventionally, ESD protection arrangements are used in integrated semiconductor circuits so as to protect input or output pins. In case of input or output pins which are used for transferring high-frequency signals, e.g. in the radio-frequency range, the provision of ESD protection is more complicated, as the additional capacitive due to the ESD protection arrangement can no longer be neglected. It is therefore desirable to reduce the effects of the additional capacitive load. At the same time, a sufficient ESD protection performance has to be maintained.

SUMMARY

A first embodiment of the invention is an ESD protection arrangement having a first protection device and a phase shifting element. The first protection device is coupled between a terminal pad and a first supply voltage rail of an integrated semiconductor circuit. The phase shifting element is coupled between the terminal pad and an intermediate circuit node of the first protection device. The phase shifting element is configured to provide a predetermined phase shift between an input signal voltage of the first protection device and a compensation voltage supplied to the intermediate circuit node.

Other embodiments will become readily apparent from the exemplary embodiments described in the detailed description and shown in the accompanying drawings.

BRIEF DESCRIPTION OF THE SEVERAL VIEWS OF THE DRAWINGS

FIG. 2 shows a table including exemplary values of an amplification A and of a phase shift Δt of a compensation loop used in an ESD protection arrangement according to an embodiment of the invention, and the associated reduction factor of the capacitive load.

DETAILED DESCRIPTION OF THE INVENTION

Figure 1:
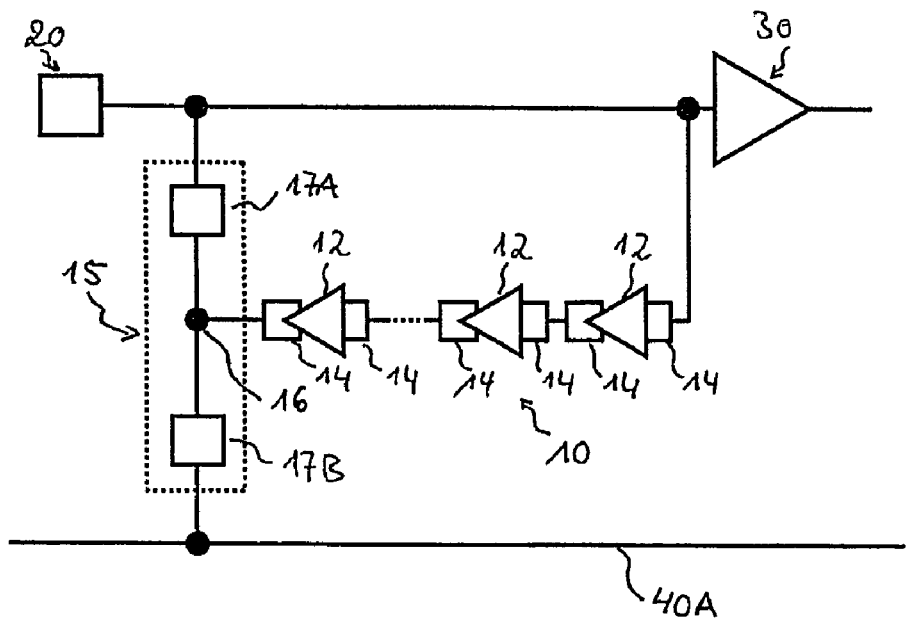
FIG. 1 shows an ESD protection arrangement according to an exemplary embodiment of the invention.

In the following, the present invention will be explained with reference to exemplary embodiments. The embodiments relate to an ESD protection arrangement and a method of ESD protection in an integrated semiconductor circuit. That is to say, the embodiments relate to the protection with respect to ESD events on a terminal pad of the integrated semiconductor circuit. The terminal pad may be an input pad, an output pad or a combined input and output pad. Further, the term "pad" may actually refer to any type of connecting structure, such as a bond pad, a solder pad, a connection pin, or the like. The integrated semiconductor circuit and the ESD protection arrangement may be implemented on a single semiconductor chip, without the use of external components. That is to say, the ESD protection arrangement may constitute an integral part of the integrated semiconductor circuit. It is to be understood that typically the integrated semiconductor circuit will comprise a plurality of terminal pads, and an ESD protection arrangement may be provided for each of the terminal pads as appropriate.

According to an embodiment, the present invention generally proposes to provide an ESD protection arrangement with a compensation loop coupled between a terminal pad of an integrated semiconductor circuit to an internal or intermediate circuit node of an ESD protection device which is coupled between the terminal pad and a supply voltage rail of the integrated semiconductor circuit. The compensation loop comprises a phase shifting element to provide a predetermined phase shift between an input signal voltage of the ESD protection device and a compensation voltage provided to the internal circuit node of the protection device. The internal circuit node, also referred to herein as the intermediate circuit node, is a node other than one connected directly to the terminal pad. Preferably, at least one element of the ESD protection device is interposed between the terminal pad and the internal or intermediate circuit node. By means of the phase shifting element, it is possible to adjust the phase shift in the compensation loop to a desired value and thereby actively compensate effects arising from the additional capacitance load of the ESD protection device.

The phase shifting element may be provided in a first portion of the compensation loop, which extends between the terminal pad and the ESD protection device, or in a second portion of the compensation loop which extends between the terminal pad and the internal (i.e. intermediate) circuit node of the ESD protection device.

If the phase shifting element is provided in the first portion of the compensation loop, it may be configured to provide a positive phase shift, i.e. to delay the signal propagation. If the phase shifting element is provided in the second portion of the compensation loop, it may be configured to provide a negative phase shift.

According to an embodiment, the compensation loop comprises a compensation amplifier. The compensation loop may have an amplification which is close to unity, e.g. in a range between 0.8 and 1.4, or even in a range between 0.9 and 1.2. According to an embodiment, the amplification is substantially 1.

According to an embodiment, the phase shift between the signal voltage on the terminal pad and the compensation voltage is adjusted to a value which is close to zero, e.g. to a value which is less than 9 ps, or even less than 5 ps. According to an embodiment, the phase shift is adjusted to a value which corresponds to substantially zero. In some embodiments, a phase shift which corresponds to a value less than 20 ps may be used.

According to an embodiment, the compensation loop comprises an inductor as said phase shifting element. By means of the inductor, a negative phase shift can be provided in the compensation loop, which compensates positive phase shifts arising from capacitive components of the compensation amplifier, from other parts of the ESD protection arrangement, from the integrated semiconductor circuit, or from external components connected to the terminal pad. That is to say, by means of the inductor-based phase shifting element, the phase shift between the input signal voltage of the ESD protection device and the compensation voltage can be efficiently tuned to a small value, which is close to zero.

According to an embodiment, an amplifier of the compensation loop comprises multiple stages, i.e. at least two stages. In this way, it is possible to use the first stage of the compensation amplifier to receive a voltage signal on the terminal pad and to use the further stage or stages of the compensation amplifier to provide the actual amplification. In such a case, the first stage of the compensation amplifier will generally present a smaller capacitive load with respect to the terminal pad than a corresponding single stage amplifier. Furthermore, the first stage of the compensation amplifier can be specifically designed to have a small input capacitance.

According to an embodiment, the ESD protection device comprises a series connection of two ESD protection elements, e.g. a series connection of two diodes, and said intermediate circuit node is located between the two ESD protection elements.

According to an embodiment, the ESD protection device comprises a thyristor and the intermediate circuit node is a control terminal of the thyristor. In this case, the protection device may further comprise a diode coupled between the control terminal of the thyristor and a further supply voltage rail of the integrated semiconductor circuit. According to the embodiment, the diode is connected in reverse direction so as to block a current between the control terminal of the thyristor and the further supply voltage rail in normal operation of the ESD protection arrangement, i.e. if there is no ESD event. The diode may be used to trigger operation of the ESD protection device, i.e. to bring the thyristor from a blocking state to a conducting state, so that an overvoltage or an undervoltage present on the terminal pad may be conducted to the supply voltage rail. In this arrangement, the control terminal of the thyristor may serve as said internal circuit node of the ESD protection device to which the compensation voltage is supplied. As compared to conventional ESD protection devices, this structure allows to increase the ESD protection performance and to reduce the capacitive load due to the ESD protection device.

According to an embodiment, the ESD protection arrangement further comprises a further ESD protection device which is coupled between the terminal pad and a further supply voltage rail of the integrated semiconductor circuit. In this way, ESD protection may be provided both for undervoltage and overvoltage conditions. The configuration of the further ESD protection device may substantially correspond to the configuration of the ESD protection device as described above. The same compensation amplifier may be used to provide the compensation voltage both to the internal circuit node of the first ESD protection device and to an internal circuit node of the further ESD protection device, thereby reducing the required circuit resources and the capacitive load with respect to the terminal pad.

The above-mentioned approach of using an inductor-based phase shifting element in the compensation loop also allows for using a variety of circuit nodes as a source of the input signal of a compensation amplifier in the second portion of the compensation loop. In particular it is not only possible to couple substantially directly the input of the compensation amplifier to the terminal pad, but also to derive the input signal of the compensation amplifier from a circuit node which is located deeper within the integrated semiconductor circuit.

According to an embodiment, an input amplifier of the integrated semiconductor circuit is connected with its input to the terminal pad, and the input signal of the compensation amplifier is derived from the output signal of the input amplifier. According to an embodiment, it is also possible to derive the input signal of the compensation amplifier from an internal circuit node of the input amplifier. In this way, a signal which is already pre-amplified may be used as the input signal of the compensation amplifier. Accordingly, the number of stages of the compensation amplifier can be reduced, or a smaller compensation amplifier may be used. In some cases it is even conceivable to dispense with the compensation amplifier. Moreover, it is possible to reduce the capacitive load with respect to the terminal pad arising from the compensation amplifier.

According to further embodiments, the invention also provides an integrated semiconductor circuit comprising at least one terminal pad provided with an ESD protection arrangement according to the above-mentioned principles and an ESD protection method based on the above-mentioned principles.

In the following, the exemplary embodiments of the invention will be explained in more detail by referring to the accompanying drawings.

FIG. 1 shows an ESD protection arrangement according to an exemplary embodiment of the invention. The ESD protection arrangement serves to protect a terminal pad 20 of an integrated semiconductor circuit in the case of an ESD event. By way of example, the figure also illustrates an input amplifier 30 of the integrated semiconductor circuit which is connected with its input to the terminal pad 20. In other embodiments, other internal structures of the integrated semiconductor circuit could be connected to the terminal pad 20, e.g. an output amplifier, a filter, or the like. For protecting the input amplifier 30 in case of an ESD event on the terminal pad 20, e.g. an overvoltage or an undervoltage, an ESD protection device 15 is coupled between the terminal pad 20 and a supply voltage rail 40A, e.g. connected to a low supply voltage. In normal operation, the ESD protection device 15 isolates the terminal pad 20 from the supply voltage rail 40A. However, in case of an ESD event, the ESD protection device 15 is triggered and changes its state from an isolating state to a conducting state, thereby allowing the overvoltage or undervoltage on the terminal pad 20 to be relieved by a current flowing to or from the supply voltage rail 40A.

According to the embodiment, the ESD protection device 15 comprises a series connection of two ESD protection elements 17A and 17B. The ESD protection elements 17A and 17B may be formed by diodes, e.g. pn-diodes or Zener diodes. Between the ESD protection elements, an internal (i.e. intermediate) circuit node 16 of the ESD protection device 15 is formed.

The ESD protection arrangement further includes a compensation loop which is formed between the terminal pad 20 and the internal circuit node 16 of the ESD protection device 15. The compensation loop is formed of two portions, a first portion extending between the terminal pad 20 and the ESD protecting device 15, and a second portion extending between the terminal pad 20 and the internal circuit node of the ESD protection device. The compensation loop comprises a compensation amplifier 10 which is arranged in the second portion of the compensation loop. The compensation amplifier 10 receives an input signal which is derived from a signal voltage present on the terminal pad 20. As its output signal, the compensation amplifier 10 provides a compensation voltage to the internal circuit node 16 of the ESD protection device 15.

As illustrated, the compensation amplifier 10 is of a multi-stage design having a plurality of amplifier stages 12. Further, the compensation amplifier 10 comprises phase shifting elements 14. By means of the phase shifting elements 14, a phase shift between the input signal voltage of the ESD protection device 15, which is supplied via the first portion of the compensation loop, and the compensation voltage, which is supplied to the internal circuit node 16 via the second portion of the compensation loop, is adjusted to a desired value. According to an embodiment, the compensation amplifier 10 is designed to have an amplification A which is close to unity, and the phase shift is adjusted to be close to zero. This case of the amplification A approaching the value of A=1 and of a phase shift approaching zero may also be referred to as bootstrap mode of the compensation loop.

Accordingly, by means of the compensation amplifier 10 having the phase shifting elements 14, the ideal case can be approached in which, also with respect to high frequency signals, e.g. in the range above 5 GHz, the internal circuit node 16 is at the same potential as the input of the ESD protection device 15 which is coupled to the terminal pad 20. Accordingly, the effects of a parasitic capacitance of the ESD protection element 17A are compensated for.

Further, the use of multiple amplifier stages 12 reduces the effects of an input capacitance of the compensation amplifier 10, as only the input capacitance of the first amplifier stage 12 has a significant effect on the signals on the terminal pad 20. According to an embodiment, the first amplifier stage 12 of the compensation amplifier 10 is used to receive the voltage signal on the terminal pad 20 with a low capacitive load presented to the terminal 20, and the following amplifier stages 12 of the compensation amplifier 10 are used to provide the actual amplification.

The compensation amplifier 10 may comprise an inductor or a plurality of inductors as said phase shifting elements 14. The use of inductors allows to counteract a positive phase shift due to capacitive components. Accordingly, a flexible way is provided to realize the above-mentioned bootstrap mode of the compensation loop.

The table of FIG. 2 shows in matrix representation exemplary values of the amplification A and of the phase shift $\Delta t$ of the compensation amplifier 10, and the associated reduction factor of the capacitive load presented to the terminal pad 20. As can be seen from the table, a significant reduction of the capacitive load is obtained if the amplification A is selected in a range between 0.8 and 1.4, and the phase shift is adjusted to have a value below 9 ps. As can further be taken from the table of FIG. 2, the possible reduction of the capacitive load decreases as the phase shift increases from the minimal value of $\Delta t$=0 ps. Also, the reduction of the capacitive load increases as the amplification A increases. It is possible to achieve a sufficient reduction of the capacitive load even in the case of a finite positive phase shift. In the upper right region of the table, the amplification A eventually becomes too large and the system becomes unstable, i.e. begins to oscillate. This can be avoided by suitably adjusting the phase shift $\Delta t$ using the phase shifting elements 14.

According to an embodiment, the phase shift $\Delta t$ and/or the amplification A are adjusted so as to take into account the additional capacitive load due to the ESD protection device 15. According to other embodiments, further capacitive loads can be taken into account. For example, capacitive loads due to external components connected to the terminal pad 20 can be taken into account. Such components may be metal layers covered on the semiconductor chip of the integrated semiconductor circuit or external packaging components.

Figure 3:
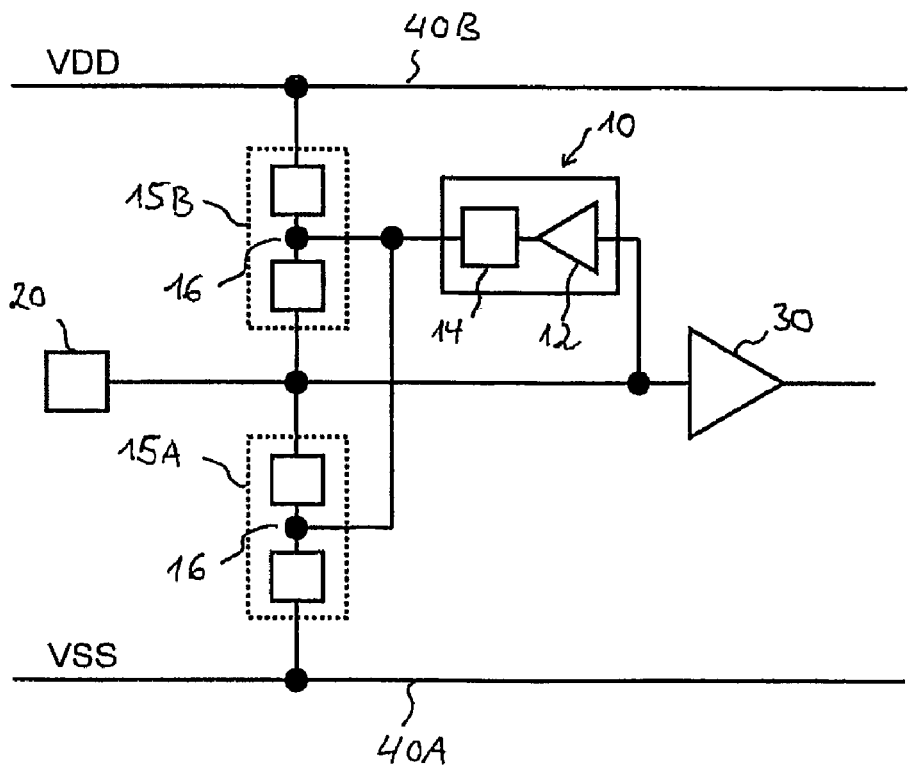
FIG. 3 shows an ESD protection arrangement according to a further exemplary embodiment of the invention.

FIG. 3 shows an ESD protection arrangement according to a further exemplary embodiment of the invention. The ESD protection arrangement of FIG. 3 generally corresponds to that of FIG. 1, and similar components have been designated with the same reference signs. In the following, only the differences as compared to the ESD arrangement of FIG. 1 will be explained.

As illustrated, the ESD protection arrangement of FIG. 3 comprises a first ESD protection device 15A coupled between the terminal pad 20 and a first supply voltage rail 40A and a second ESD protection device 15B coupled between the terminal pad 20 and a second supply voltage rail 40B. The first supply voltage rail 40A may be connected to a low supply voltage VSS, and the second supply voltage rail 40B may be connected to a high supply voltage VDD. The ESD protection devices 15A and 15B may substantially correspond to the ESD protection device 15 as described in connection with FIG. 1.

In the ESD protection arrangement of FIG. 3 protection is provided both with respect to an undervoltage condition and with respect to an overvoltage condition. In particular, an overvoltage may be relieved via the first ESD protection device 15A to the first supply voltage rail, and an undervoltage may be relieved via the second ESD protection device 15B to the second supply voltage rail 40B.

In FIG. 3 the compensation amplifier 10 is schematically illustrated and provides the compensation voltage to the internal circuit node 16 of both the first ESD protection device 15A and of the second ESD protection device 15B. By having only a single compensation amplifier for both ESD protection devices 15A, 15B, the capacitive load due to the compensation loop is kept at a low value. The schematic illustration of FIG. 3 shows only a single amplifier stage 12 and a single phase shifting element 14. However, it is to be understood that a larger number of amplifier stages 12 and/or of phase shifting elements 14 may be provided.

Figure 4:
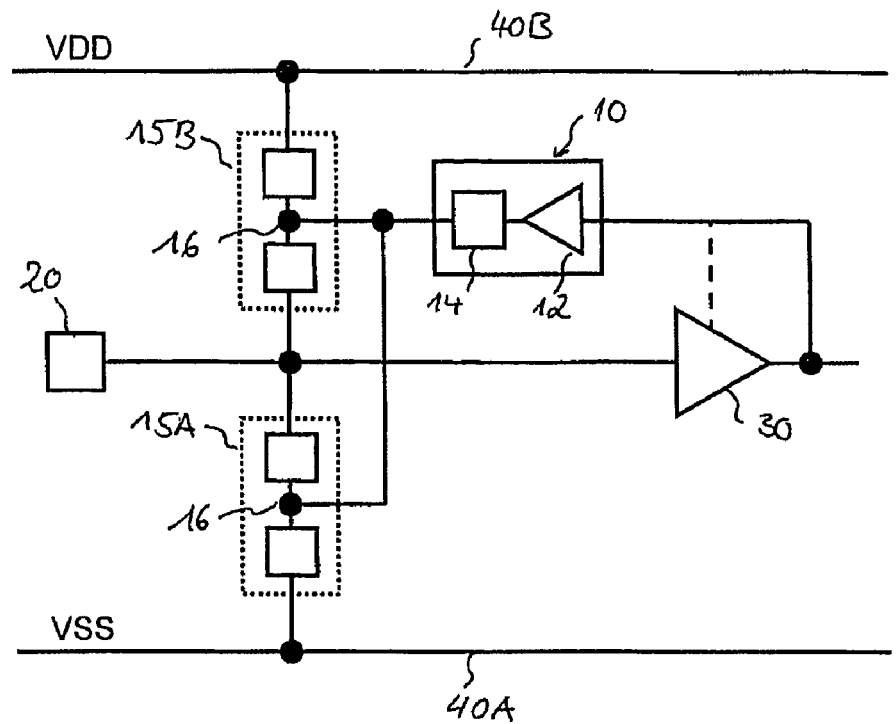
FIG. 4 illustrates modifications of the ESD protection arrangement from FIG. 3, according to further exemplary embodiments of the invention.

FIG. 4 illustrates modifications of the ESD protection arrangement of FIG. 3. In FIG. 4, components which substantially correspond to those of FIG. 3 have been designated with the same reference signs and further description thereof will be omitted.

As compared to FIG. 3, the ESD arrangement of FIG. 4 uses a different source for the input signal of the compensation amplifier 10. As illustrated, the input signal of the compensation amplifier 10 is derived from an output signal of the input amplifier 30 connected to the terminal pad 20. Accordingly, the input amplifier 30 is included into the compensation loop, and the amplification of the input amplifier 30 can be utilized in the compensation loop. By this means, the configuration of the compensation amplifier 10 can be simplified, e.g. by providing a lower amplification factor or by providing less amplifier stages 12. Further, the capacitive load due to the compensation loop is further reduced, as there are no additional components which are directly connected to the terminal pad 20. The additional phase shift in the compensation loop which is due to the input amplifier 30 can be easily compensated by means of the phase shifting elements 14 in the compensation loop. Further, including the input amplifier 30 into the compensation loop increases the flexibility with respect to the selection of the ESD protection devices 15A and 15B.

According to a further embodiment, as illustrated by the broken line in FIG. 4, only a part of the input amplifier 30 may be included in the compensation loop. That is to say, the input signal of the compensation amplifier 10 may be derived from an internal signal of the input amplifier 30. For example, the input amplifier 30 may comprise multiple amplifier stages and the input signal of the compensation amplifier 10 may be tapped at an intermediate point between these stages.

Figure 5:
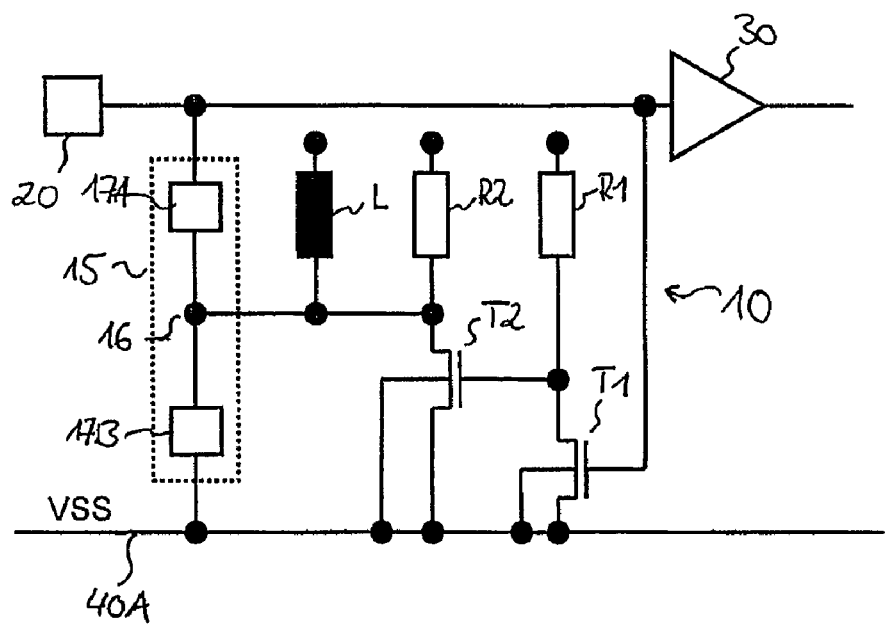
FIG. 5 shows a multi-stage compensation amplifier in an ESD protection arrangement according to an exemplary embodiment of the invention.

FIG. 5 schematically illustrates an embodiment of a multi-stage compensation amplifier 10 in an ESD protection arrangement according to an embodiment of the invention. The ESD protection arrangement generally corresponds to that as illustrated in FIG. 1, and components which substantially correspond to those of FIG. 1 have been designated with the same reference signs.

As illustrated, the compensation amplifier 10 of FIG. 5 is of a two-stage type. The compensation amplifier 10 comprises a series connection of a first transistor T1 and a first resistor R1, which is coupled between the supply voltage rail 40A and a further supply voltage. As indicated above, the supply voltage rail 40A may be connected to the low supply voltage VSS. In this case, the further supply voltage may be the high supply voltage VDD. A control terminal of the first transistor T1 forms the signal input of the compensation amplifier 10.

The compensation amplifier 10 further comprises a series connection of a second transistor T2 and a second resistor R2, which is coupled between the supply voltage rail 40A and the further supply voltage. A control terminal of the second transistor T2 is coupled to a circuit node between the first transistor T1 and the first resistor R1. An output signal of the compensation amplifier 10 is tapped at a circuit node between the second transistor T2 and the second resistor R2.

Further, an inductor L is coupled between the circuit node between the second transistor T2 and the second resistor R2, and the further supply voltage. The inductor L serves as a phase shifting element of the compensation amplifier 10. In particular, the inductor L provides a negative phase shift which counteracts a positive phase shift due to capacitive components in the compensation loop and other capacitive components. Accordingly, by adjusting the inductance of the inductor L, the resistances of the resistors R1 and R2, and the parameters of the transistors T1 and T2, the phase shift of the compensation loop can be tuned to a desired value. In FIG. 5 the transistors T1 and T2 are shown to have their substrate connected to the supply voltage rail 40A. In other embodiments, such a connection may be omitted, or a connection to a different circuit node may be provided.

Figure 6:
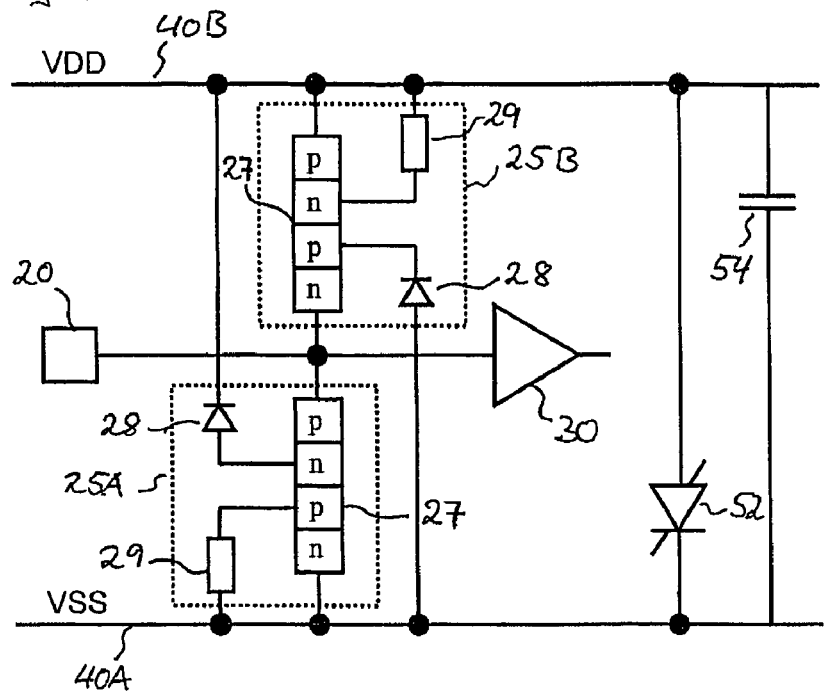
FIG. 6 shows an ESD protection arrangement according to a further exemplary embodiment of the invention.
Figure 7:
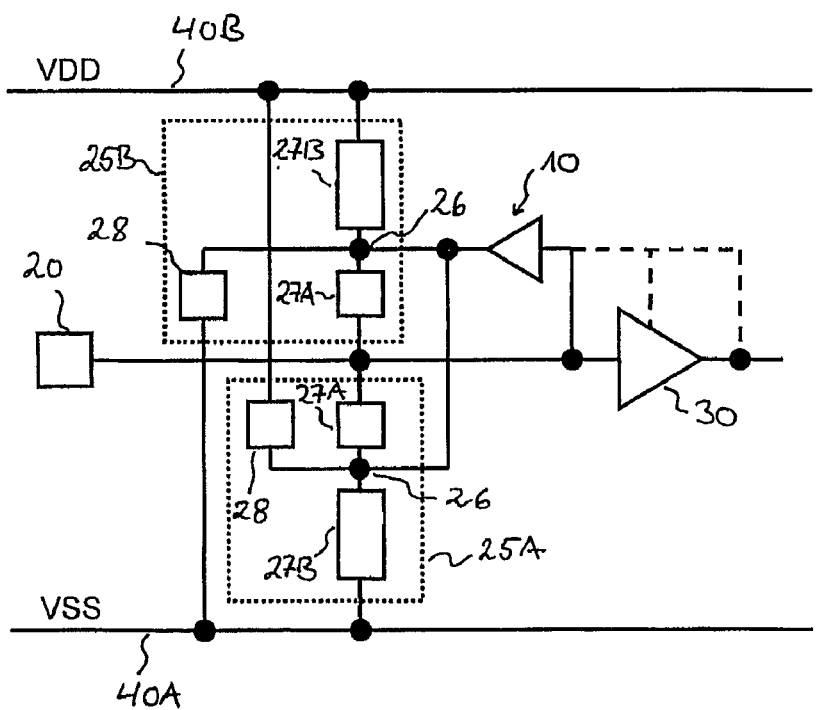
FIG. 7 schematically illustrates the implementation of a compensation loop in the ESD protection arrangement from FIG. 6.

With reference to FIGS. 6 and 7, a further exemplary embodiment of an ESD protection arrangement is described, which is based on a specific type of ESD protection device. In FIGS. 6 and 7 components which correspond to those of FIGS. 1, 3, 4, and 5 have been designated with the same reference signs, and further description thereof will be omitted. Generally, the ESD protection arrangement of FIG. 6 corresponds to that which has been described with reference to FIGS. 3 and 4. However, a specific type of first ESD protection device 25A and second ESD protection device 25B is used. The first and second ESD protection devices 25A and 25B are based on a thyristor 27 and a diode 28.

As compared to the ESD protection arrangement of FIG. 3, the ESD protection arrangement of FIG. 6 further comprises a power clamp 52 coupled between the first supply voltage rail 40A and the second supply voltage rail 40B. Further illustrated is a blocking capacitor 54 coupled between the first supply voltage rail 40A and the second supply voltage rail 40B. The power clamp 52 provides protection in case of an overvoltage or an undervoltage on the first supply voltage rail 40A and/or the second supply voltage rail 40B. The blocking capacitor 54 allows for a transient current to flow in an ESD event which involves grounding of the supply voltage rails 40A, 40B or the like.

As illustrated, the first ESD protection device 25A comprises a thyristor, i.e. a semiconductor structure having a pnpn-doping pattern, coupled between the terminal pad 20 and the first supply voltage rail 40A. In particular, the thyristor 27 is coupled with its outer p-terminal to the terminal pad 20 and with its outer n-terminal to the first supply rail 40A, which is connected to the low supply voltage VSS. Accordingly, in normal operation, the thyristor 27 blocks a current flowing from the terminal pad 20 to the first supply voltage rail 40A.

The first ESD protection device 25A further comprises a diode 28 which is connected between an n-control terminal of the thyristor 27 and the second supply voltage rail 40B, which is connected to the high supply voltage VDD. The diode 28 may be a pn-diode which has its p-terminal connected to the n-control terminal of the thyristor 27.

In normal operation, the diode 28 blocks a current flowing from the second supply voltage rail 40B to the n-control terminal of the thyristor 27. However, in case of an ESD event, the diode 28 provides for a transient triggering of the thyristor 27, i.e. causes the thyristor 27 to switch into a conducting state due to a transient trigger current flowing through the diode 28 to the first supply voltage rail 40A, via the second supply voltage rail 40B and via the blocking capacitor 54. Further, the first ESD protection device 25A comprises a resistor 29 coupled between the p-control terminal of the thyristor 27 and the first supply voltage rail 40A.

The second ESD protection device 25B generally has a similar structure as the first ESD protection device 25A. However, in this case the thyristor 27 has its outer n-terminal coupled to the terminal pad 20 and its outer p-terminal coupled to the second supply voltage rail 40B. Accordingly, in normal operation the thyristor 27 blocks a current flowing from the second supply voltage rail 40B to the terminal pad 20.

The second ESD protection device 25B further comprises a diode 28 connected between the p-control terminal of the thyristor 27 and the first supply voltage rail 40A. The diode 28 may be a pn-diode which has its n-terminal connected to the p-control terminal of the thyristor 27. In normal operation, the diode 28 blocks a current flowing from the p-control terminal of the thyristor 27 to the first supply voltage rail 40A. However, in case of an ESD event, the diode 28 triggers the thyristor 27, i.e. causes the thyristor 27 to switch into a conducting state due to a transient trigger current flowing through the diode 28 to the second supply voltage rail 40B, via the first supply voltage rail 40A and via the blocking capacitor 54.

Further, the second ESD protection device 25B comprises a resistor 29 coupled between the n-control terminal of the thyristor 27 and the second supply voltage rail 40B.

The structure of the ESD protection devices 25A, 25B as illustrated in FIG. 6 allows for an improved ESD protection performance, as no series connection of ESD protection elements is required. Further, the diodes 28 represent a capacitance which is connected in series to the first pn-junction of the thyristors 27, thereby further reducing the capacitive load.

FIG. 7 shows an implementation of the compensation loop as described in connection with FIGS. 1, 3, 4, and 5 in the ESD protection arrangement of FIG. 6. In FIG. 7, the first ESD protection device 25A and the second ESD protection device 25B have been illustrated in a schematic representation. In particular, the thyristors 27 are shown as two separated blocks 27A and 27B, which are connected at an intermediate circuit node 26. In essence, the division of the thyristors 27 into two blocks 27A, 27B is achieved by the diodes 28, which create a floating circuit point at the control terminal of the thyristor 27, to which they are connected.

Accordingly, in the representation of FIG. 6, the intermediate circuit node 26 corresponds to the n-control terminal of the thyristor 27 in the first ESD protection device 25A and to the p-control terminal of the thyristor 27 in the second ESD protection device 25B. The second portions of the thyristors 27B may actually comprise further circuit components, such as the resistors 29. That is to say, the internal circuit node 26 of the ESD protection devices 25A, 25B does not require a series connection of two ESD protection elements. Accordingly, a high ESD protection performance can be obtained.

As illustrated by the broken lines in FIG. 7, the arrangement may be modified with respect to the source of the input signal of the compensation amplifier 10. That is to say, the input signal of the compensation amplifier 10 may be derived from an internal signal of the input amplifier 30 or from the output signal of the input amplifier 30, as has been described with reference to FIG. 4.

Although this is not explicitly illustrated in FIG. 7, it is to be understood that also in this case the compensation amplifier 10 has at least one phase shifting element 14 and may be of a multi-stage type.

Figure 8:
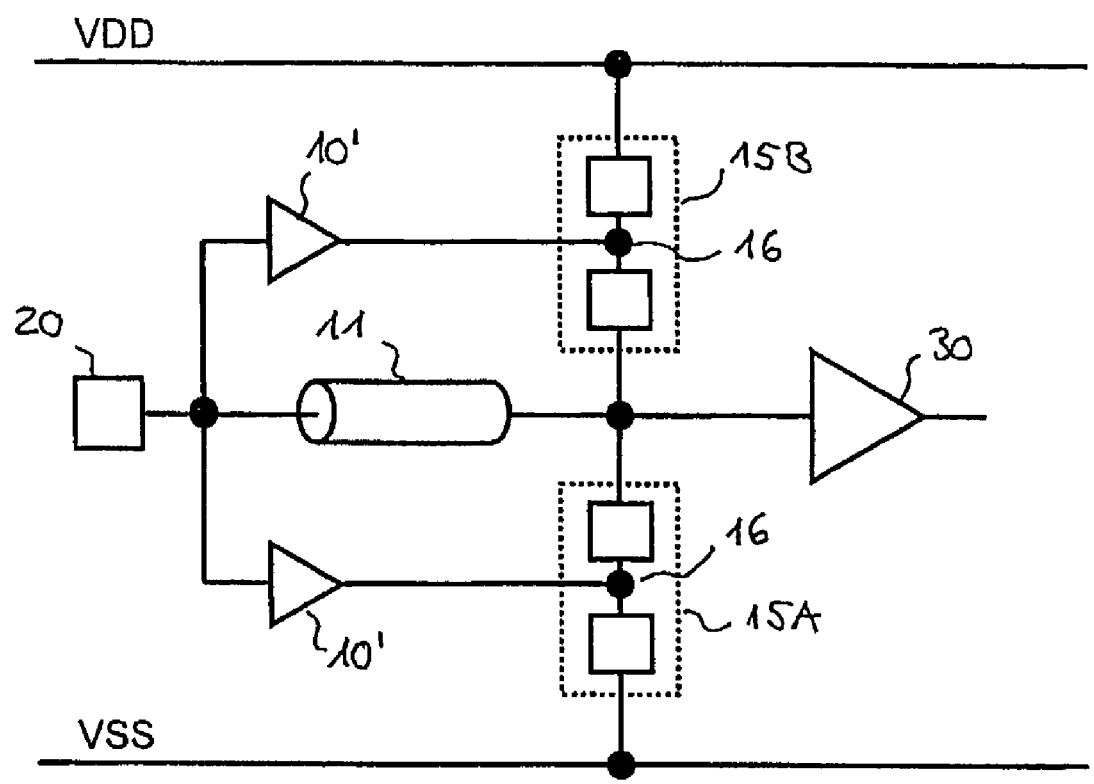
FIG. 8 shows an ESD protection arrangement according to a further exemplary embodiment of the invention.

FIG. 8 shows an ESD protection arrangement according to a further exemplary embodiment of the invention. The ESD protection arrangement of FIG. 8 generally corresponds to that as illustrated in FIG. 3, and components which substantially correspond to those of FIG. 3 have been designated with the same reference signs. In the following, only the differences as compared to the ESD protection arrangement from FIG. 3 will be explained.

In the ESD protection arrangement of FIG. 8, a phase shifting element 11 is provided, which is arranged in the first portion of the compensation loop. That is to say, the phase shifting element 11 is arranged between the terminal pad 20 and the input amplifier 30, and more specifically between the terminal pad 20 and a circuit node coupling the ESD protection devices 15A and 15B to the terminal pad 20.

Further, the ESD protection arrangement comprises compensation amplifiers 10', which are arranged in the second portion of the compensation loop. As illustrated, one compensation amplifier 10' is provided for each of the ESD protection devices 15A and 15B. In other embodiments, only a single compensation amplifier 10' may be provided which supplies a compensation voltage to the internal circuit nodes 16 of both ESD protection devices 15A and 15B.

The phase shifting element 11 is of a type which provides a positive phase shift, e.g. may be configured as a delay line. Accordingly, the phase shift between the compensation voltage supplied to the internal circuit node 16 of the ESD protection devices 15A, 15B and the signal voltage coupled to the internal circuit node 16 via the first portion of the compensation loop, which includes the phase shifting element 11, can be adjusted to a desired value. In particular, by means of the compensation amplifiers 10' and the phase shifting 11, the compensation loop can be adjusted to operate according to the above-mentioned bootstrap mode.

According to an embodiment, a delay provided by the phase shifting element 11 is adjusted to a value which corresponds to a delay of the compensation amplifiers 10'. For example, this may be accomplished by using a transmission line having a corresponding length. According to an embodiment, the phase shifting element 11 comprises a transmission line having a length of about 1.5 mm.

It is to be understood that the above-described exemplary embodiments are merely illustrative and not intended to limit the scope of the present invention. In particular, various modifications are possible within the described exemplary embodiments. For example, the type of ESD protection devices may be varied, and compensation amplifiers having different designs may be used. Various numbers of amplifier stages and phase shifting elements may be selected. Further, it is possible to combine the embodiments with each other as appropriate. Also, it is to be understood that in the exemplary embodiment any shown or described direct connection or coupling between two functional blocks, devices, components, or other physical or functional units could also be implemented by indirect connection or coupling.

What is claimed is:

1. An integrated semiconductor circuit, comprising:
a first ESD protection device having an input node coupled to a terminal pad of the integrated semiconductor circuit and an output node coupled to a first supply voltage rail of the integrated semiconductor circuit, and
a compensation loop coupled between the input node and an intermediate circuit node of the first ESD protection device to provide a compensation voltage to the intermediate circuit node,
wherein the compensation loop comprises a phase shifting element with a negative phase shift to provide a predetermined phase shift between an input signal voltage at the input node of the first protection device and the compensation voltage.

2. The integrated semiconductor circuit according to claim 1, wherein an amplification of the compensation loop is in a range from 0.8 to 1.4.

3. The integrated semiconductor circuit according to claim 2, wherein the amplification of the compensation loop is substantially 1.

4. The integrated semiconductor circuit according to claim 1, wherein the compensation loop includes a compensation amplifier.

5. The integrated semiconductor circuit according to claim 4, wherein the compensation amplifier includes at least two stages.

6. The integrated semiconductor circuit according to claim 1, wherein the predetermined phase shift corresponds to less than 9 ps.

7. The integrated semiconductor circuit according to claim 1, wherein the predetermined phase shift corresponds to substantially zero.

8. The integrated semiconductor circuit according to claim 1, wherein the first ESD protection device comprises a series connection of two protection elements, and wherein the intermediate circuit node is located between the protection elements.

9. The integrated semiconductor circuit according to claim 1, wherein the first ESD protection device comprises a thyristor, and
wherein the intermediate circuit node comprises a control terminal of the thyristor.

10. The integrated semiconductor circuit according to claim 9, wherein the first ESD protection device further comprises a diode coupled between the control terminal of the thyristor and a second supply voltage rail.

11. The integrated semiconductor circuit according to claim 1, comprising:

a second ESD protection device coupled between the terminal pad and a second supply voltage rail of the integrated semiconductor circuit,
wherein the compensation voltage is further supplied to an intermediate circuit node of the second ESD protection device.

12. The integrated semiconductor circuit according to claim 11,
wherein the second ESD protection device comprises a series connection of two protection elements, and wherein the intermediate circuit node of the second ESD protection device is located between the protection elements.

13. The integrated semiconductor circuit according to claim 12,
wherein the second ESD protection device comprises a thyristor, and wherein the intermediate circuit node of the second ESD protection device is a control terminal of the thyristor.

14. The integrated semiconductor circuit according to claim 13, wherein the ESD second protection device further comprises a diode coupled between the control terminal of the thyristor and the first supply voltage rail.

15. The integrated semiconductor circuit according to claim 1,
wherein the phase shifting element includes an inductor.

16. The integrated semiconductor circuit according to claim 1, wherein the compensation loop further includes at least a portion of an input amplifier connected to the terminal pad.

17. The integrated semiconductor circuit according to claim 1, wherein the compensation loop comprises a compensation amplifier and an input signal of the compensation amplifier is derived from an internal signal of an input amplifier connected to the terminal pad.

18. An integrated semiconductor circuit, comprising:
a first ESD protection device having an input node coupled to a terminal pad of the integrated semiconductor circuit and an output node coupled to a first supply voltage rail of the integrated semiconductor circuit,
a compensation loop coupled between the terminal pad and an intermediate circuit node of the first ESD protection device to provide a compensation voltage to the intermediate circuit node, and
a phase shifting element with a positive phase shift coupled between the terminal pad and the input node of the first ESD protection device so as to provide a predetermined phase shift between an input signal voltage at the input node of the first ESD protection device and the compensation voltage.

19. The integrated semiconductor circuit according to claim 18, wherein the compensation loop comprises a compensation amplifier.

20. The integrated semiconductor circuit according to claim 18, wherein an amplification of the compensation loop is in a range from 0.8 to 1.4.

21. The integrated semiconductor circuit according to claim 20, wherein the amplification of the compensation loop is substantially 1.

22. The integrated semiconductor circuit according to claim 18, wherein the predetermined phase shift corresponds to less than 9 ps.

23. The integrated semiconductor circuit according to claim 18, wherein the predetermined phase shift corresponds to substantially zero.

24. The integrated semiconductor circuit according to claim 18, wherein the phase shifting element includes a delay line.

25. An ESD protection method, comprising:
providing an ESD protection device having an input node coupled to a terminal pad of an integrated semiconductor circuit and an output node coupled to a supply voltage rail of the integrated semiconductor circuit,
providing a compensation loop between the input node and an intermediate circuit node of the ESD protection device,
providing a delay element with a negative phase shift in the compensation loop so as to adjust a predetermined phase shift between an input signal voltage at the input node of the ESD protection device and the compensation voltage.

26. The ESD protection method according to claim 25, comprising:
adjusting an amplification of the compensation loop in a range from 0.8 to 1.4.

27. The ESD protection method according to claim 26, wherein the amplification is adjusted to substantially 1.

28. The ESD protection method according to claim 25, wherein the predetermined phase shift is adjusted to correspond to less than 9 ps.

29. The ESD protection method according to claim 25, wherein the predetermined phase shift is adjusted to correspond to substantially zero.

30. The ESD protection method according to claim 25, wherein the predetermined phase shift is adjusted depending on external components to be connected to the terminal pad.

31. An ESD protection method, comprising:
providing an ESD protection device having an input node coupled to a terminal pad of an integrated semiconductor circuit and an output node coupled to a supply voltage rail of the integrated semiconductor circuit,
providing a compensation loop between the terminal pad and an intermediate circuit node of the ESD protection device,
coupling a delay element with a positive phase shift between the terminal pad and the input node of the ESD protection device so as to adjust a predetermined phase shift between an input signal voltage at the input node of the ESD protection device and the compensation voltage.

32. The ESD protection method according to claim 31, comprising:
adjusting an amplification of the compensation loop in a range from 0.8 to 1.4.

33. The ESD protection method according to claim 32, wherein the amplification is adjusted to substantially 1.

34. The ESD protection method according to claim 31, wherein the predetermined phase shift is adjusted to correspond to less than 9 ps.

35. The ESD protection method according to claim 31, wherein the predetermined phase shift is adjusted to correspond to substantially zero.

36. The ESD protection method according to claim 31, wherein the predetermined phase shift is adjusted depending on external components to be connected to the terminal pad.

* * * * *